(12) United States Patent
Zieger

(10) Patent No.: US 8,043,115 B2
(45) Date of Patent: Oct. 25, 2011

(54) APPARATUS AND METHODS

(75) Inventor: Thomas Zieger, San Diego, CA (US)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 12/340,543

(22) Filed: Dec. 19, 2008

(65) Prior Publication Data

US 2010/0159714 A1  Jun. 24, 2010

(51) Int. Cl.
*H01R 11/00*  (2006.01)
(52) U.S. Cl. .................................. 439/502; 455/575.3
(58) Field of Classification Search .............. 439/77, 439/162, 502; 174/254; 361/749; 379/433.12; 455/575.3
See application file for complete search history.

(56) References Cited

U.S. PATENT DOCUMENTS

| 4,988,890 A * | 1/1991 | Narhi et al. | 307/147 |
| 2007/0254524 A1* | 11/2007 | Chang | 439/505 |

FOREIGN PATENT DOCUMENTS

| EP | 2 046 103 | 4/2009 |
| WO | WO-2008/013070 | 1/2008 |
| WO | WO-2009/113124 | 9/2009 |

OTHER PUBLICATIONS

International Search Report for PCT Application No. PCT/EP2009/067351 dated Feb. 19, 2010.

* cited by examiner

*Primary Examiner* — Khiem Nguyen
(74) *Attorney, Agent, or Firm* — Harrington & Smith

(57) ABSTRACT

Apparatus configured to be foldable from an unfolded configuration into an in-use folded configuration. The apparatus, when in the unfolded configuration, comprising: a flexible substrate having first and second opposing ends with respective first and second connectors located at respective first and second opposing ends; and a third connector located on the flexible substrate between the first and second opposing ends. The apparatus is configured to be folded from the unfolded configuration into the in-use folded configuration to bring the first and second connectors together.

19 Claims, 2 Drawing Sheets

APPARATUS AND METHODS

TECHNICAL FIELD

The present disclosure relates to the field of electronic apparatus configured to connect two electronic modules together, and in particular, for electronic modules that are movable relative to each other in use, associated methods, computer programs and apparatus. Certain disclosed aspects/embodiments relate to portable electronic devices, in particular, so-called hand-portable electronic devices which may be hand-held in use (although they may be placed in a cradle in use). Such hand-portable electronic devices include so-called Personal Digital Assistants (PDAs).

The portable electronic devices/apparatus according to one or more disclosed aspects/embodiments may provide one or more audio/text/video communication functions (e.g. telecommunication, video-communication, and/or text transmission (Short Message Service (SMS)/Multimedia Message Service (MMS)/emailing) functions), interactive/non-interactive viewing functions (e.g. web-browsing, navigation, TV/program viewing functions), music recording/playing functions (e.g. MP3 or other format and/or (FM/AM) radio broadcast recording/playing), downloading/sending of data functions, image capture function (e.g. using a (e.g. in-built) digital camera), and gaming functions.

BACKGROUND

Slide-type electronic devices, such as mobile telephones, are known. Such electronic devices use flexible printed circuit boards (FPCs) to connect between the modules that move relative to each other during sliding. Typically, an FPC is designed as a flat cable with connectors at each end. When installed into the electronic device, the FPC forms a U-shape that allows it to follow the sliding motion by rolling along its longitudinal axis.

In systems where space is limited, the FPC is provided with wires on each side of the flexible substrate so as to reduce the width of the FPC.

Flexible printed circuit boards are known that use two parallel substrates between two connectors, wherein each of the substrates carries a layer of wires between the connectors. In such examples, the substrates are joined together at their two ends, near the connectors so as to provide a gap between the two substrates between the two ends of the FPC. Such an example may be known as an air gap FPC.

However, the use of air gaps in slide application devices can create some challenges to the dynamic performance. Due to the FPC manufacturing process, both conductor layers/substrates in the FPC are the same length. This means that when the FPC is folded in use, a "kink" (also known as "flex buckling") can appear in the inner layer when the FPC is assembled in the electronic device. The kink can severely affect the dynamic durability of the flexible printed circuit board, and can also generate an unwanted clicking sound during movement of the slide.

A known way to resolve the "kink" problem is to create a permanent kink in a strategic position of the inner conductor layer using a pre-bend technique. This pre-bend/kink effectively shortens the inner radius layer to eliminate or reduce problems created by using an air gap flexible printed circuit board. However, the crimping process that is required to create the permanent kink can damage the flex, and special machinery may be required for semi-automatic pre-bend application to ensure the pre-bend is made in the same way every time.

A conventional two-layer build-up may not withstand the rolling motion often enough to be suitable for use in some devices, such as mobile telephones.

The listing or discussion of a prior-published document or any background in this specification should not necessarily be taken as an acknowledgement that the document or background is part of the state of the art or is common general knowledge. One or more aspects/embodiments of the present disclosure may or may not address one or more of the background issues.

SUMMARY

In a first aspect, there is provided apparatus configured to be foldable from an unfolded configuration into an in-use folded configuration, the apparatus, when in the unfolded configuration, comprising:
  a flexible substrate having first and second opposing ends with respective first and second connectors located at respective first and second opposing ends; and
  a third connector located on the flexible substrate between the first and second opposing ends; and
  wherein the apparatus is configured to be folded from the unfolded configuration into the in-use folded configuration to bring the first and second connectors together.

In some embodiments, bringing the first and second connectors together may be considered as locating the first and second connectors relative to each other such that they can be connected to the same electronic module in use. For example, the connectors may be brought together such that they are adjacent to each other in the in-use folded configuration, and/or such that they are at the same end of the apparatus in the folded configuration. When the connectors are brought together they may be brought into the vicinity of each other to enable convenient connections to associated electronic modules to be achieved.

Providing an apparatus with the above unfolded configuration and in-use folded configuration can enable a connector to be provided that can account for the different distances between the first and third connectors, and second and third connectors when the apparatus is in the in-use folded configuration. The apparatus may be convenient to manufacture due to the structure of the unfolded configuration, and may also reduce the chances of the flexible substrate being mechanically deformed, for example through the generation of a kink in the flexible substrate, when the apparatus is in use.

In some embodiments, the overall width of the apparatus can be reduced when compared with a single layer apparatus.

The apparatus may be a flexible printed circuit. The first and second connectors may be brought together to be substantially opposing the third connector. The first and second ends of the flexible substrate may be at longitudinally opposite ends of the flexible substrate.

The flexible substrate may be configured to be foldable about a first folding location in order to provide the in-use folded configuration, wherein the first and second connectors are located at one end of the in-use folded configuration and the third connector is located at the other end of the in-use folded configuration.

The first folding location may be near the third connector such that the third connector is near an end of the apparatus when it is in the in-use folded configuration. Providing the apparatus in the in-use configuration with the connectors at either end of the apparatus can enable surplus flexible substrate material to be reduced.

The flexible substrate may comprise a first leg between the first and third connector, and a second leg between the second and third connectors. The first leg may be longer than the second leg in order to account for the different lengths between the connectors when the apparatus is in the in-use folded configuration.

The first, second and third connectors may all on the same side of the flexible substrate when the apparatus is in the unfolded configuration. Providing the first, second and third connectors on the same side of the flexible substrate can provide for a convenient manufacturing process.

The flexible substrate may be foldable at a second folding location near either of the first or second connectors. In this way, the first and second connectors may be on the same side of the apparatus when it is in the in-use folded configuration. The first and second connectors may be adjacent to each other when the apparatus is in the in-use folded configuration. Having the first and second connectors on the same side of the apparatus and/or adjacent to each other when it is in the folded configuration can enable convenient for attachment to a part of a device.

The apparatus may further comprise one or more signal conduits connecting the first connector to the third connector. The apparatus may also comprise one or more signal conduits connecting the second connector to the third connector.

The one or more signal conduits may be located on only one side of the flexible substrate. Providing the one or more signal conduits on only one side of the flexible substrate can improve the mechanical performance of the apparatus. In other embodiments, one or more signal conduits may be provided on both sides of the flexible substrate.

The third connector may be approximately equidistant between the first and second connectors. The third connector may be slightly off-centre between the first and second connectors such that when the apparatus is in the in-use folded configuration, the length of the flexible substrate between the first and third connectors is slightly longer than the length of the flexible substrate between the second and third connectors. The difference in the length of the flexible substrate between the connectors may account for the curvatures of the inner and outer regions of the flexible substrate when the apparatus is in the in-use folded configuration.

The apparatus may be for connecting a first electronic module to a second electronic module. The first and second electronic module may be associated with respective first and second parts of an electronic device.

According to a further aspect, there is provided a device comprising an apparatus, the apparatus configured to be foldable from an unfolded configuration into an in-use folded configuration, the apparatus, when in the unfolded configuration, comprising:
  a flexible substrate having first and second opposing ends with respective first and second connectors located at respective first and second opposing ends; and
  a third connector located on the flexible substrate between the first and second opposing ends; and
  wherein the apparatus is configured to be folded from the unfolded configuration into the in-use folded configuration to bring the first and second connectors together.

The device may comprise a first part and a second part, wherein the first part and second part are moveable relative to each other, and the first and second connectors of the apparatus are connected to the first part of the device and the third connector of the apparatus is connected to the second part of the device.

According to a further aspect, there is provided a module for a device, the module comprising an apparatus, the apparatus configured to be foldable from an unfolded configuration into an in-use folded configuration, the apparatus, when in the unfolded configuration, comprising:
  a flexible substrate having first and second opposing ends with respective first and second connectors located at respective first and second opposing ends; and
  a third connector located on the flexible substrate between the first and second opposing ends; and
  wherein the apparatus is configured to be folded from the unfolded configuration into the in-use folded configuration to bring the first and second connectors together.

According to a further aspect, there is provided a method of assembling an apparatus, the apparatus configured to be foldable from an unfolded configuration into an in-use folded configuration, the apparatus, when in the unfolded configuration, comprising:
  a flexible substrate having first and second opposing ends with respective first and second connectors located at respective first and second opposing ends; and
  a third connector located on the flexible substrate between the first and second opposing ends; and
  wherein the apparatus is configured to be folded from the unfolded configuration into the in-use folded configuration to bring the first and second connectors together.

According to a further aspect, there is provided a method of assembling a device, the device comprising an apparatus, the apparatus configured to be foldable from an unfolded configuration into an in-use folded configuration, the apparatus, when in the unfolded configuration, comprising:
  a flexible substrate having first and second opposing ends with respective first and second connectors located at respective first and second opposing ends; and
  a third connector located on the flexible substrate between the first and second opposing ends; and
  wherein the apparatus is configured to be folded from the unfolded configuration into the in-use folded configuration to bring the first and second connectors together.

According to a further aspect, there is provided apparatus configured to be foldable from an unfolded configuration into an in-use folded configuration, the apparatus, when in the unfolded configuration, comprising:
  a flexible substrate means having first and second opposing ends with respective first and second means for connecting located at respective first and second opposing ends; and
  a third means for connecting located on the flexible substrate between the first and second opposing ends; and
  wherein the apparatus is configured to be folded from the unfolded configuration into the in-use folded configuration to bring the first and second means for connecting together.

The present disclosure includes one or more corresponding aspects, embodiments or features in isolation or in various combinations whether or not specifically stated (including claimed) in that combination or in isolation. Corresponding means for performing one or more of the discussed functions are also within the present disclosure.

The above summary is intended to be merely exemplary and non-limiting.

BRIEF DESCRIPTION OF THE FIGURES

A description is now given, by way of example only, with reference to the accompanying drawings, in which.

DESCRIPTION OF SPECIFIC ASPECTS/EMBODIMENTS

Embodiments described herein can provide a flexible printed circuit board having an unfolded configuration and an in-use folded configuration. The flexible printed circuit can be manufactured in the unfolded configuration, and in some embodiments the flexible printed circuit board can have three connectors that are all located on the same side of the flexible printed circuit board in the unfolded configuration. When the flexible printed circuit board is folded to provide an in-use folded configuration, the first and second of the connectors may be brought together so that they can be connected to a first module of an electronic device, and the third connector is configured so that it can be connected to a second module of an electronic device. In this way, the flexible printed circuit board provides an interconnection between the two electronic modules of a slide type electronic device.

Providing a flexible printed circuit in this way can enable a first leg between the first and third connector, and a second leg between the second and third connector, to have different lengths, thereby accounting for the different distance between the connectors when the flexible printed circuit board is in use in the folded configuration.

Figure 1A:
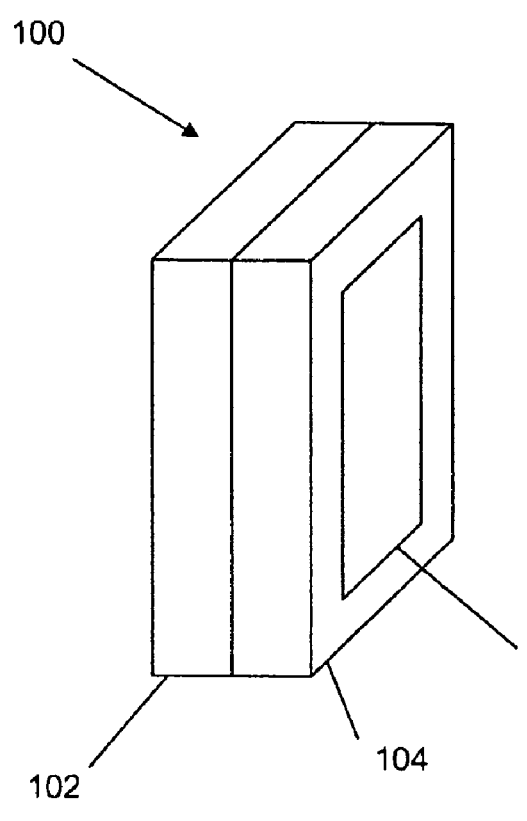
FIGS. 1a and 1b show a device according to an embodiment of the invention.
Figure 1B:
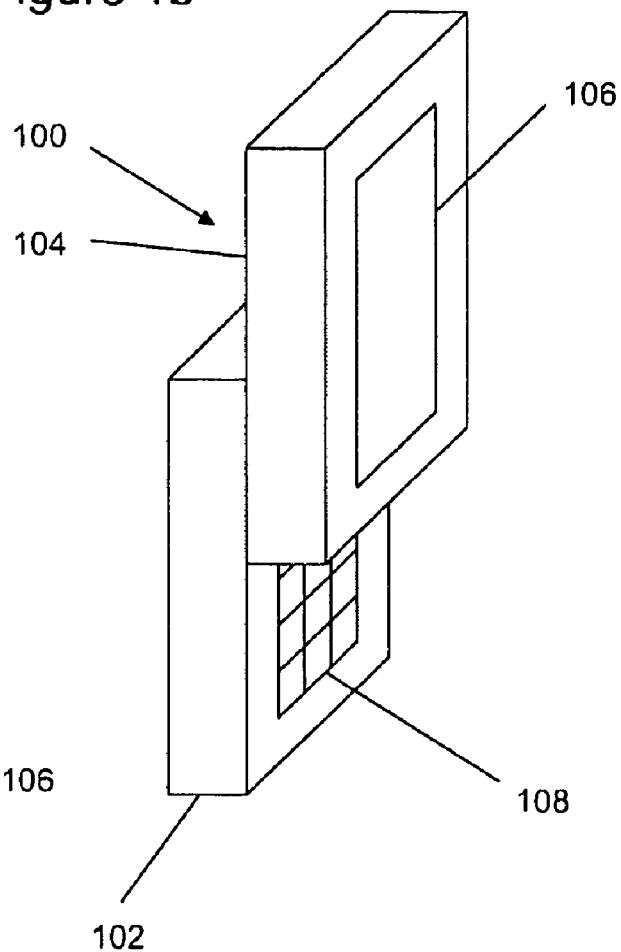

FIG. 1 illustrates a device 100 according to an embodiment of the invention. FIG. 1a illustrates the device 100 in a closed configuration, and FIG. 1b illustrates the device 100 in an open configuration. In this example the device 100 is a mobile telephone.

The device 100 has a first part 102 and a second part 104 that are movable relative to each other. In the closed configuration illustrated in FIG. 1a, the first and second parts 102,104 completely overlap each other, such that the device 100 has a mono-block form factor.

The second part 104 of the device 100 has a display 106 on its outer surface that is visible to a user when the device 100 is in both the open configuration and the closed configuration. The first part 102 has a keypad 108 that is concealed by the second part 104 when the device is in the closed configuration, but is exposed when the second part 104 slides relative to the first part 102 to change from the closed configuration illustrated in FIG. 1a to the open configuration illustrated in FIG. 1b.

It will be appreciated that the first and second parts 102,104 are in electronic communication with each other, and that there must be provided some sort of connector, typically known as a flexible printed circuit, that enables electronic signals to pass from components in the first part 102 to components in the second part 104.

Figure 2:
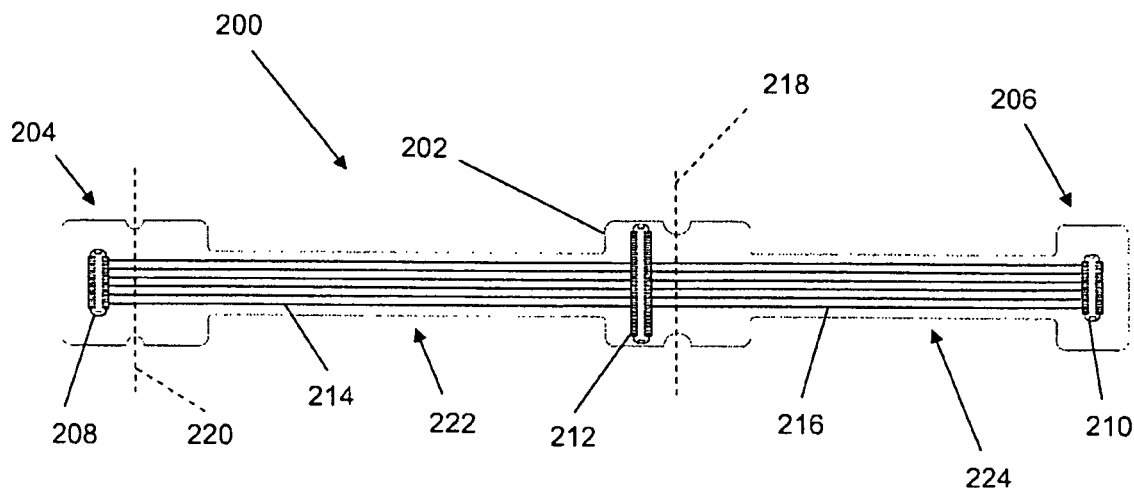
FIG. 2 shows a flexible printed circuit board in an unfolded configuration according to an embodiment of the invention.

FIG. 2 illustrates a flexible printed circuit 200 according to an embodiment of the invention in an unfolded configuration. The flexible printed circuit (FPC) 200 comprises a flexible substrate 202 having a first end 204 and a second end 206. The first and second ends 204,206 are longitudinally opposite ends of the flexible printed circuit 200.

Located at the first end 204 of the FPC 200 is a first connector 208, and located at the second end 206 of the FPC 200 is a second connector 210. The FPC also includes a third connector 212 located on the flexible substrate 202 between the first and second connectors 208,210.

The FPC 200 includes a plurality of signal conduits, which in this example are copper wires 214 connecting the first connector 208 to the third connector 212, and also includes a second set of signal conduits, which again in this embodiment are copper wires 216 that connect the second connector 210 to the third connector 212.

Figure 3:
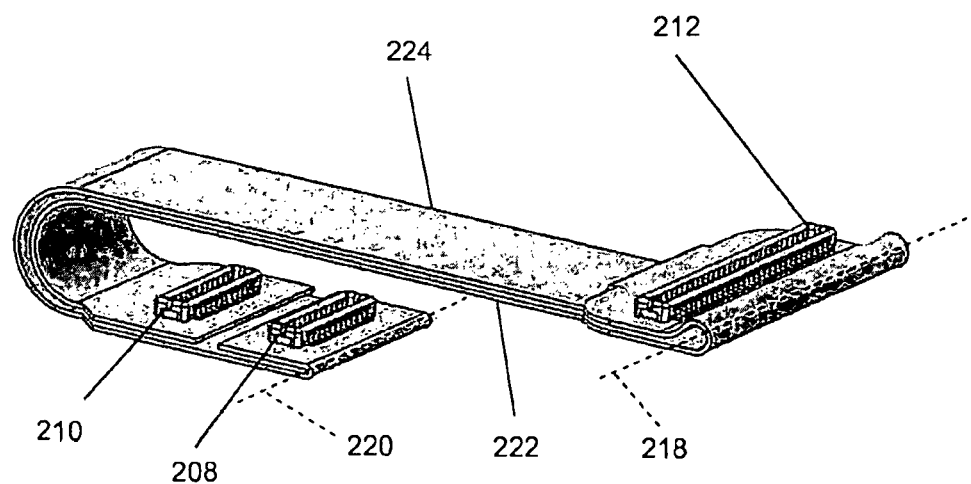
FIG. 3 shows the flexible printed circuit board of FIG. 2 in a folded configuration.

The FPC 200 is arranged such that it can be folded about a first fold line 218 in order to bring the first and second connectors 208, 210 together. When the FPC 200 is folded about first fold line 218, the FPC 200 is in an in-use folded configuration as illustrated in FIG. 3.

When the FPC 200 is in the in-use folded configuration, the first and second connectors 208,210 can be connected to a first part of an electronic device (for example the first part 102 illustrated in FIG. 1) and the third connector 212 can be connected to a second part of an electronic device (for example the second part 104 illustrated in FIG. 1).

The first fold line 218 is near the third connector 212 such that the third connector 212 is near an end of the flexible printed circuit 200 when it is in the folded configuration.

In this embodiment, the first, second and third connectors 208, 210, 212 are all located on the same side of the flexible substrate 202 when the FPC 200 is in the open configuration. This can make the FPC 200 easier to manufacture, and reduce manufacturing costs.

In such an embodiment, the FPC 200 also comprises a second fold line 220 between the first connector 208 and the third connector 212 such that when the FPC 200 is in the folded configuration, the first connector 208 can be folded back on itself such that it is adjacent to, and on the same side as, the second connector 210.

However, it will be appreciated that in other embodiments, the first and second connectors 208, 210 may be on opposite sides of the FPC 200 when it is in a folded configuration in order to connect to appropriate connection points on the appropriate part of the electronic device.

In this embodiment, the region of the flexible substrate 202 between the first connector 208 and the third connector 212 may be considered as a first leg/arm of the FPC 200, and the region of the flexible substrate 202 between the second connector 210 and the third connector 212 may be considered as a second leg/arm 224 of the FPC 200.

In this embodiment, the second leg 224 is shorter than the first leg 222 to account for the different radius of curvature when the FPC 200 is in the in-use folded configuration illustrated in FIG. 3. Providing the first and second legs 222,224 with different lengths can reduce the mechanical stress of the two legs 222,224, and reduce the chance that one or more kinks/buckles appear in the flexible substrate 202.

Embodiments of the invention described herein can allow for the design of a flexible printed circuit board with two separate layers, where the inner layer can be slightly shorter than the outer layer. In order to install the FPC into an electronic device, it can be formed into a U-shape (the in-use folded configuration) such that the inner layer is shorter than the outside layer. This may be in contrast to a conventional two-layer FPC of the prior art where the inner layer can be too long. Additionally, the single layer build-up, that is the unfolded FPC illustrated in FIG. 1, can be cheaper to manufacture compared with the known two-layer build-ups.

Embodiments described herein can improve the lifetime of a flexible printed circuit board (FCP).

Embodiments described herein may be considered as providing an "origami" technique for folding the FPC. By doing this a double sided FPC build-up may no longer necessary. Instead a single sided build-up may provide enough space for all signals, yet occupy less space after folding. An FPC according to an embodiment described herein may occupy less space in a width dimension. This can also allow the inner radius layer to be provided that is slightly shorter than the outer radius layer, and can avoid, or reduce the chances of a kink effect. It can also eliminate/reduce the need to have the inner layer 'crimped' by applying a pre-bend to the FPC as discussed above. A disadvantage of the crimped prior art examples may cause the flex to break due to a concentration of mechanical stress at the crimped area/kink during the dynamic movement.

It will be appreciated that embodiments described herein relate to an interconnection method for a slide type electronic device. Embodiments of the invention can overcome some reliability issues and provide for a smooth movement of the FPC and the parts of the device to which the FPC is connected. Traditional solutions may suffer from the layers of the FPC buckling during the slide movement.

Embodiments described herein can enable signal traces from the main connector (third connector 212 in FIG. 2) to be easily routed to each of the small connectors (first and second connectors 208, 210 in FIG. 2) by using only one copper layer. FIG. 3 shows the "Origami-slider" in its folded form. The slide area on the left side of the illustration shows the different radii of the two parts of the flexible printed circuit board due to the different length of those parts.

It will be appreciated that the flexible printed circuit boards described herein can be used with any electronic device that has moving electronic sub modules. Embodiments described herein can be particularly advantageous for electronic devices with sliding components, such as sliding mobile telephones.

In embodiments, where the flexible substrate has independent legs of different lengths, this can allow the slide to open and close without the layers buckling against each other. This can provide a cheaper and more efficient construction than fitting two separate FPC's to a common connector.

In some embodiments, one or more of the connectors may be integrated with one of the electronic modules/moving parts with which it is associated. That is, one or more of the connectors may be pre-connected to an electronic module. In such embodiments, an end of the apparatus/flexible substrate may be considered as carrying electronics/circuitry. An electronic module may be manufactured with the apparatus/flexible printed circuit (FPC) attached to it, such that the electronic module/moving part is a module having an apparatus attached thereto, wherein a distal end of the apparatus can be connected to another electronic module/moving part, in use.

It will be appreciated to the skilled reader that the apparatus/device/server and/or other features of particular apparatus/device/server may be provided by apparatus arranged such that they become configured to carry out the desired operations only when enabled, e.g. switched on, or the like. In such cases, they may not necessarily have the appropriate software loaded into the active memory in the non-enabled (e.g. switched off state) and only load the appropriate software in the enabled (e.g. on state). The apparatus may comprise hardware circuitry and/or firmware. The apparatus may comprise software loaded onto memory. Such software/computer programs may be recorded on the same memory/processor and/or on one or more memories/processors.

It will be appreciated that the aforementioned apparatus/circuitry/elements/processor may have other functions in addition to the mentioned functions, and that these functions may be performed by the same apparatus/circuitry/elements/processor. One or more disclosed aspects may encompass the electronic distribution of associated computer programs and computer programs (which may be source/transport encoded) recorded on an appropriate carrier (e.g. memory, signal).

With reference to any discussion of processor and memory (e.g. including ROM, CD-ROM etc), these may comprise a computer processor, Application Specific Integrated Circuit (ASIC), field-programmable gate array (FPGA), and/or other hardware components that have been programmed in such a way to carry out the inventive function.

The applicant hereby discloses in isolation each individual feature described herein and any combination of two or more such features, to the extent that such features or combinations are capable of being carried out based on the present specification as a whole, in the light of the common general knowledge of a person skilled in the art, irrespective of whether such features or combinations of features solve any problems disclosed herein, and without limitation to the scope of the claims. The applicant indicates that the disclosed aspects/embodiments may consist of any such individual feature or combination of features. In view of the foregoing description it will be evident to a person skilled in the art that various modifications may be made within the scope of the disclosure.

While there have been shown and described and pointed out fundamental novel features of the invention as applied to preferred embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

The invention claimed is:

1. An apparatus configured to be foldable from an unfolded configuration into an in-use folded configuration, the apparatus, when in the unfolded configuration, comprising;
   a flexible substrate having first and second opposing ends with respective first and second connectors located at respective first and second opposing ends; and
   a third connector located on the flexible substrate between the first and second opposing ends;
      wherein the apparatus is configured to be folded from the unfolded configuration into the in-use folded configuration to bring the first and second connectors together;
   wherein the flexible substrate comprises a first leg between the first and third connectors, and a second leg between the second and third connectors; and
   wherein the apparatus is configured such that, when the apparatus is in the in-use folded configuration, the first leg is longer than the second leg in order to account for the different lengths between the connectors when the apparatus is in the in-use folded configuration.

2. The apparatus of claim 1, wherein the apparatus is a flexible printed circuit.

3. The apparatus of claim 1, wherein the flexible substrate is configured to be foldable about a first folding location in order to provide the in-use folded configuration, wherein the first and second connectors are located at one end of the in-use folded configuration and the third connector is located at the other end of the in-use folded configuration.

4. The apparatus of claim 3, wherein the first folding location is near the third connector such that the third connector is near an end of the apparatus when it is in the in-use folded configuration.

5. The apparatus of claim 1, wherein the first, second and third connectors are all on the same side of the flexible substrate when the apparatus is in the unfolded configuration.

6. The apparatus of claim 1, wherein the flexible substrate is foldable at a second folding location near either of the first or second connectors such that first and second connectors are on the same side of the apparatus when it is in the in-use folded configuration.

7. The apparatus of claim 1, wherein the first and second connectors are adjacent to each other when the apparatus is in the in-use folded configuration.

8. The apparatus of claim 1, further comprising one or more signal conduits connecting the first connector to the third connector, and one or more signal conduits connecting the second connector to the third connector.

9. The apparatus of claim 8, wherein the one or more signal conduits are located on only one side of the flexible substrate.

10. The apparatus of claim 1, wherein the third connector is approximately equidistant between the first and second connectors.

11. The apparatus of claim 1, wherein the apparatus is for connecting a first electronic module to a second electronic module.

12. A device comprising the apparatus of claim 1.

13. The device of claim 12, comprising a first part and a second part, wherein the first part and Second part are moveable relative to each other, and the first and second connectors of the apparatus are connected to the first part of the device and the third connector of the apparatus is connected to the second part of the device.

14. A module for a device, the module comprising the apparatus of claim 1.

15. A method of assembling the apparatus according to claim 1.

16. A method of assembling the device according to claim 12.

17. Apparatus configured to be foldable from an unfolded configuration into an in-use folded configuration, the apparatus, when in the unfolded configuration, comprising:
- a flexible substrate means having first and second opposing ends with respective first and second means for connecting located at respective first and second opposing ends; and
- a third means for connecting located on the flexible substrate between the first and second opposing ends;
- wherein the apparatus is configured to be folded from the unfolded configuration into the in-use folded configuration to bring the first and second means for connecting together;
- wherein the flexible substrate means comprises a first leg means between the first and third means for connecting, and a second leg means between the second and third means for connecting; and
- wherein the apparatus is configured such that, when the apparatus is in the in-use folded configuration, the first leg means is longer than the second leg means in order to account for the different lengths between the means for connecting when the apparatus is in the in-use folded configuration.

18. The apparatus of claim 1, wherein the flexible substrate is substantially elongate and the first and second connectors are located at respective first and second opposing ends of the elongate flexible substrate.

19. The apparatus of claim 1, wherein the apparatus is configured to connect a first electronic module to a second electronic module and wherein the first electric module is configurable to slide with respect to the second electronic module.

* * * * *